United States Patent [19]
Tilton et al.

[11] Patent Number: 5,220,804
[45] Date of Patent: Jun. 22, 1993

[54] HIGH HEAT FLUX EVAPORATIVE SPRAY COOLING

[75] Inventors: Donald E. Tilton; Charles L. Tilton, both of Kent, Wash.

[73] Assignee: Isothermal Systems Research, Inc, Colton, Wash.

[21] Appl. No.: 805,869

[22] Filed: Dec. 9, 1991

[51] Int. Cl.⁵ ............................................. F25D 17/02
[52] U.S. Cl. ...................................... 62/64; 361/385; 62/376
[58] Field of Search ...................... 62/373, 376, 259.2, 62/64; 361/381, 382, 385

[56] References Cited

U.S. PATENT DOCUMENTS

| | | | |
|---|---|---|---|
| 2,845,472 | 7/1958 | Narbut | 62/376 |
| 3,004,406 | 10/1961 | Foote et al. | 62/373 |
| 3,339,373 | 9/1967 | Mobius et al. | 62/373 |
| 4,056,949 | 11/1977 | Hahn | 62/373 |
| 4,371,149 | 2/1983 | Takeuchi et al. | 266/90 |
| 4,711,431 | 12/1987 | Viannay et al. | 266/114 |
| 5,131,233 | 7/1992 | Cray et al. | 62/64 |

Primary Examiner—Albert J. Makay
Assistant Examiner—William C. Doerrler
Attorney, Agent, or Firm—Russell W. Illich

[57] ABSTRACT

A compact and efficient spray cooling system is provided for cooling a heat source or a plurality of heat sources. The system uses at least one atomizer arranged in an array to deliver a fine spray across a wide distribution to impinge upon the surface to be cooled. The spray maintains a thin liquid film upon the cooled surface where heat is transfered in a phase change process. The liquid and vapor resulting from the heat transfer process is removed from the system at the edges of the heat source(s) and uses the momentum of the original spray to move the vapor and liquid to a fluid removal port. The use of the momentum of the spray to remove the liquid from the system allows the system to be gravity independent and used in transportation, avionics, and spacecraft applications where adverse gravity conditions exist. The atomizer array can be spaced closely to the heat source because the individual atomizers develop the spray in a relatively short distance. This allows the entire cooling system to be arranged in a compact and efficient package with wide ranging applications.

10 Claims, 4 Drawing Sheets

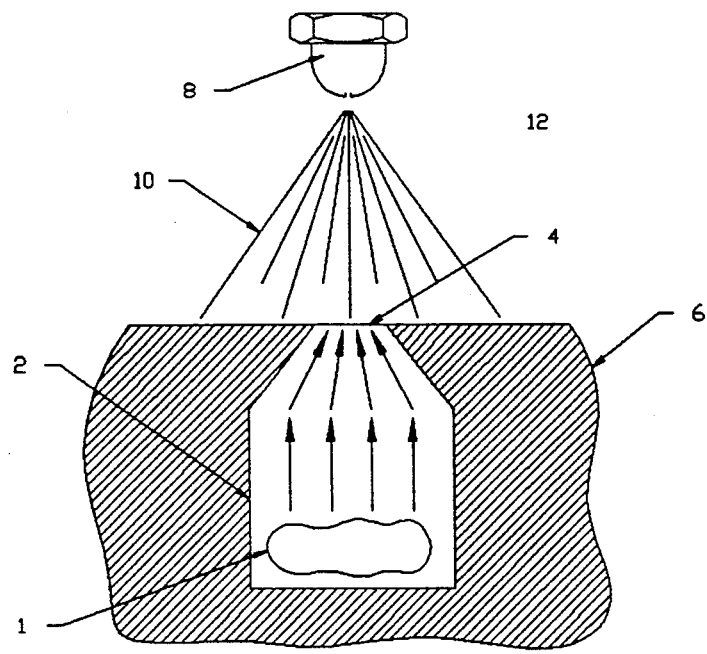
FIG.1
PRIOR ART
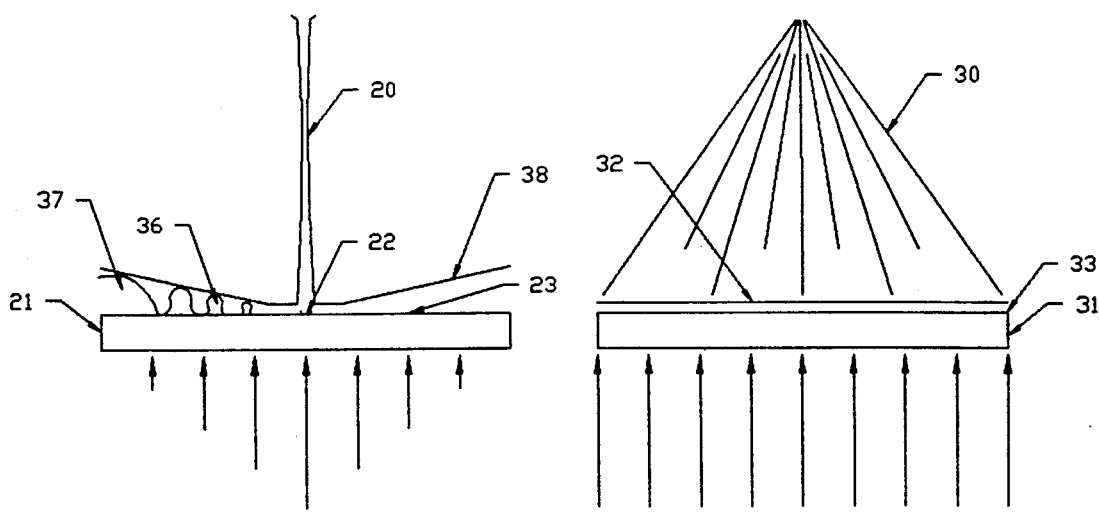
FIG.2
PRIOR ART
FIG.3
PRIOR ART

SECTION 1-1

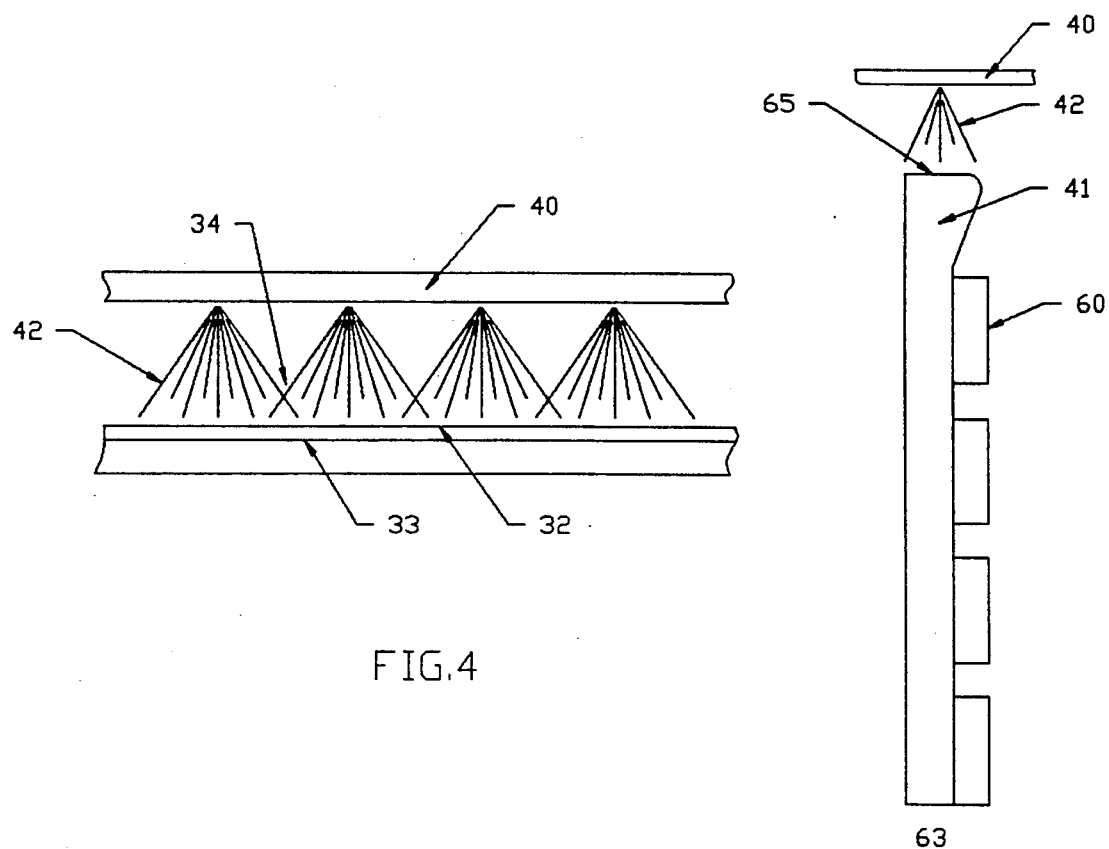
FIG.4
FIG.5
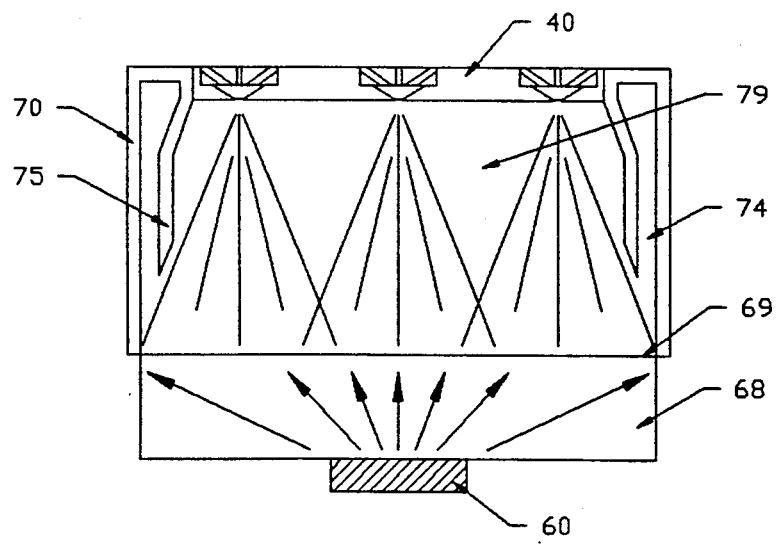
FIG.6

HIGH HEAT FLUX EVAPORATIVE SPRAY COOLING

BACKGROUND OF THE INVENTION

The present invention relates to a cooling method for devices which need to be actively cooled to function efficiently. Although not limited to such, the primary application for this invention is for the cooling of microelectronic systems, devices or chips, which generate relatively large quantities of heat during operation, and which need to be cooled to reduce the risk of malfunction.

The present invention provides cooling by the continuous supply and removal of a liquid coolant to the one or more surfaces to be cooled. The fluid is delivered in a finely atomized spray of liquid droplets, the spray forming a generally wide area distribution as it issues from the atomizer. Fluid is removed from the periphery of the surface by mechanical pumping. As will be made clear in the later description, the nature of the atomizers, atomized spray and fluid removal are key elements of the invention.

There have been numerous investigations and experiments into the capabilities of spray cooling. However, these investigations have, in most cases, been limited to a single, conventional atomizer that is commercially available. It will be shown that these nozzles are generally unsuitable for viable spray cooling. Additionally, these experiments have failed to address the many issues which must be resolved before spray cooling can be considered useful for the applications considered herein.

One set of experiments investigating the usefulness of spray cooling was conducted by one of the authors of the present invention, Donald E. Tilton, and the results of these experiments are summarized within a publication titled "Closed-System, High-Flux Evaporative spray Cooling", published in 1989. This research paper examined many of the variables involved in spray cooling, but did not implement a fully viable spray cooling system. Namely, the experiments relied upon the use of conventional atomizers, and did not provide for efficient fluid removal in a compact package. It does, however, establish the most advanced state of the prior art in the field of evaporative spray cooling.

Much of the commercial research and development of liquid cooling systems for microelectronics has been concentrated within the related field of jet impingement cooling, which consists of high velocity, narrow jets, or jet, of liquid directed upon the surface to be cooled.

Although the jet impingement method may appear nearly identical to spray cooling, particularly in that a liquid coolant is discharged from an orifice and directed at the cooled surface, there are many fundamental and significant differences in the fluid dynamics and heat transfer mechanisms between the impingement of a fluid jet, and the impingement of a well dispersed and finely atomized spray of liquid droplets over a much larger area. Jet impingement cooling has limitations which render it inherently inferior to spray cooling. It does not provide uniformity of cooling over the surface, requires higher flow rates for an equivalent average heat flux, and burns out (transition to vapor film boiling with consequent drastic increase in surface temperature) at lower critical heat fluxes than spray cooling.

The following description relates to FIG. 2, which depicts a liquid jet 20 cooling a heat source 21 in a phase change process. The highest heat flux is removed, as shown by the arrows, only in a very small area 22 directly under the jet in the stagnation region. After impinging upon the surface 23, the fluid 38 spreads radially away from the center of impingement. Two conditions are immediately obvious: one, the substantial momentum of the jet is no longer available to enable high heat flux. Specifically, the high efficiency cooling available from jet impingement occurs only upon the stagnation field directly under the center of the jet. Away from the center of the jet, with no appreciable momentum towards the surface 21, vapor 36 generated at the surface 21 can displace the liquid 38 from the surface, leading to burnout. Burnout occurs when vapor 37 completely displaces liquid 38. Two, the further the fluid travels radially from the center, the more the fluid slows down due to the fluid covering more area. Thus there is less tendency to displace hot liquid and vapor on the surface, and the heat flux must decrease. These radial variations in heat transfer directly result in surface temperature variations, and thermally induced stresses. This is highly undesirable with microelectronics, where such stresses are the leading cause of failure.

A further consequence of the uneven heat removal is a critical heat flux (CHF) lower than that achievable with spray cooling. When cooled by a jet, the outer region of an area transitions to film boiling (hence, where CHF occurs) at a relatively low heat flux, due to the lower heat transfer coefficients. This both reduces the heat removal in these areas, and increases the local surface temperature. This instantly places an incrementally larger heat removal burden on the inner areas, which cannot be accommodated because there is no corresponding incremental increase in heat transfer capability. Thus the film boiling phenomena quickly travels radially inward.

Closely packing jets to cool an area has two benefits in that the number of high flux areas are increased, and the total area cooled by each jet is decreased. These benefits are quickly offset by the geometrically increasing difficulty in delivering and removing the large quantities of fluid. As will be made clear in the description of the invention, the present invention does not suffer from these limitations.

Within the field of jet impingement cooling, several patents have been issued in which high flux cooling has been envisioned. One example is U.S. Pat. No. 4,108,242 to Searight et al. This patent addresses the issue of liquid, after contacting the heat source, rebounding off of the heat source and interfering with the original jet. Searight attempts to solve this issue by greatly increasing the volume of the system, so that the fluid has a place to go upon leaving the immediate area of the impinging jet. This solution is not very suitable for high flux cooling, and runs counter to compact packaging requirements. When one considers the total area of the heat exchanger within Searight's system, only a small portion is devoted to the high flux capability of the impinging jets.

U.S. Pat. No. 4,912,600 to Jaeger et al, another example of a jet impingement cooling system, also suffers the shortcomings mentioned in relation to FIG. 2. Also, the chips themselves are subjected to additional forces from the turbulent flow existing in the chamber, which could lead to chips detaching from the substrate after a period of time.

U.S. Pat. No. 4,838,041 to Bellows attempts to address the issue of fluid rebound/interference and vapor build-up within a jet impingement apparatus. Bellows uses a heat spreader for directing the fluid away from the area of the impinging jet. However, each spreader is several times larger than the microchip itself. Also, the spreader introduces an interfacial conduction resistance, which causes the chip to operate at a higher temperature for the same coolant temperature. The volume of the Bellows system remains relatively large due to the inherent problems associated with jet impingement cooling systems.

U.S. Pat. No. 3,844,343 to Burggraf has an appearance similar to the present invention. The heat transfer mechanism of the submerged jet single phase cooling is not nearly as efficient as evaporative spray cooling, however. Larger temperature differences and higher flow rates are required to gain the same cooling effect. Neither does this system have a fluid management component designed to maintain a thin liquid film on the heat source, as does the present invention.

U.S. Pat. Nos. 4,643,250 and 4,790,370 to Niggeman et al both attempt to describe an apparatus capable of providing evaporative cooling in the absence of gravity, or under adverse acceleration. U.S. Pat. No. 4,643,250 proposes to separate the liquid and vapor components of stored cryogen and use the liquid to condense the vapor. Since the quantity of liquid produced can only be less than the quantity of liquid thus vaporized, it is unclear why one would inefficiently condense the separated vapor to liquid instead of disposing of the vapor as waste. This question aside, the pertinent geometry which provides the jet impingement-assisted cooling is, for all practical purposes, identical to the previously mentioned U.S. Pat. No. 3,844,343 to Burggraf. Consequently, the Niggemann '250 system suffers from the same drawbacks and limitations as the Burgraff system. Additionally, the Niggemann '250 system suffers from the disadvantage of requiring a substantially increased operating pressure in order to provide sufficient pressure drop for the two sets of orifices in series. In the case of jetting a saturated fluid, this increased pressure is not available. With respect to the present invention this device is overly large for the amount of cooling provided.

The Niggemann '370 patent purports to provide an evaporative cooling system which can sustain momentary loss, or inversion of the gravity vector; gravity being what produces the buoyancy forces necessary for pool boiling to function. The means to achieve this is meant to be a pressurized non-condensable gas in conjunction with a blockage chamber. However, buoyancy forces are the result of gravity, or another acceleration, and not operating pressure. So, regardless of the system pressure, once boiling equilibrium is reached, if the module is inverted or subjected to "zero-g", buoyancy will be lost and the vapor bubbles growing on the surface will separate the liquid from the surface, causing burnout. Compared to the present invention, this evaporative cooling system is extremely large, capable of only 1/10th of the critical heat flux, and gravity dependent.

In contrast to prior art jet impingement cooling systems, prior art spray cooling systems have certain advantages, but with attendant problems associated with the viable application of spray cooling. FIG. 3 depicts a general cross-sectional view of spray cooling of a surface. A conical spray 30 impacts against a heat source 31 and forms a thin liquid film 32 which covers the entire surface 33 of the heat source. The heat flux arrows indicate a uniform heat removal across the entire surface 33. Uniform heat removal is important in reducing thermal stresses, and in delaying transition to CHF. The even heat removal is achieved by the uniform impingement of the liquid droplets over the entire area. The impinging droplets serve to mix the liquid on the surface, and to disrupt nucleating bubbles within the liquid film. Disrupting the growing vapor bubbles delays the transition to vapor film boiling (CHF), which occurs when liquid can no longer displace vapor from the surface. Keeping the liquid well mixed and in good contact with the cooled surface promotes heat removal by direct evaporation from the top of the liquid layer.

Although the uniform heat removal of a spray cooling system has definite advantages over the non-uniform heat removal of a jet impingement cooling system, there are attendant problems associated with spray cooling that have not been resolved in prior art spray cooling devices. As mentioned earlier, experimental spray cooling approaches have used a single conventional atomizer. A conventional atomizer must be spaced some inches from the heat source in order for the spray to fully develop prior to impacting against the surface to be cooled. In the field of electronics where miniaturization is critical, the size of a microchip (often less than ¼ inch square) would be dwarfed by the distance needed for a spray to develop into a wide area distribution of droplets. Another problem associated with experimental prior art spray cooling systems, is that there have been no effective solutions proposed for removing the fluid from the system. Other problems associated with prior art spray cooling systems is that they have not addressed the issue of gravity dependence of the system nor the issue of vapor build-up within the system volume.

U.S. Pat. No. 4,352,392 to Eastman provides insight into prior art evaporative spray cooling. In this invention one can see the atomizer, spraying distance and system volume are all large with respect to the evaporator surface, or heat source. Further, there is no means for efficient removal of fluid. In the closed system embodiment depicted, the liquid and vapor are actually allowed to separate in the volume, and are removed separately. It can be appreciated that this system is inefficient, bulky, and gravity dependent.

U.S. Pat. No. 4,967,829 to Albers et al. is another example of prior art evaporative spray cooling. Once again, the high heat removal capability which is inherent in spray cooling is recognized, but the overall benefit available is not realized when the system volume is so large and inefficient. This system also requires very large distances to be traversed by the spray, leading to further inefficiency. Also, it relies on gravity to maintain the desired conditions within the volume.

SUMMARY OF THE INVENTION

It is an object of this invention to provide an atomized spray cooling system wherein the atomizers are miniaturized into substantially flat, closely spaced arrays.

It is another object of this invention to maximize heat transfer performance (providing for a high heat removal per unit area), while simultaneously providing large volume reductions to the cooling package. The means of heat transfer is evaporative cooling.

It is another object of the invention to provide a high heat flux, generally greater than 50 Watts per square centimeter, with lower flow rates, and a smaller temperature difference between fluid and surface as compared to other techniques, with less fluid subcooling.

It is also an object of this invention to provide a spray cooling system with an efficient fluid removal technique, preventing fluid and vapor build-up which subsequently would destroy the desired thin liquid film conditions created by the atomizers.

Another object of the invention is to provide a spray cooling system that is orientation independent and is able to operate under adverse accelerations and gravity conditions.

It is a further object of the invention to provide a spray cooling system that has a high uniform heat flux over the entire cooled surface with a minimum overall power requirement for the cooling system.

Other objects of the invention will be apparent hereinafter from the specification and from the recital of the appended claims, particularly when read in conjunction with the accompanying drawings.

The present invention comprises a spray cooling system for the removal of heat from the surface(s) of a heat source(s). The heat source may be any one of many possible devices, of particular concern here are microelectronic devices. Central to the invention is a unique atomizing nozzle which can be very closely positioned to the heat source, thereby minimizing both the momentum loss in the spray before reaching the surface, and the volume of the system. The cooling system of the present invention can utilize these atomizers singly, or as in a closely spaced array for the cooling of a larger area, or of multiple heat sources.

BRIEF DESCRIPTION OF THE DRAWINGS

FIG. 1 shows a partial cross sectional view of a prior art experimental apparatus for spray cooling.

FIGS. 2 and 3 show comparable prior art schematic views of the heat transfer characteristics of jet impingement and spray cooling, respectively.

FIG. 4 shows a version of the present invention illustrating the use of intersecting sprays.

FIG. 5 shows a schematic of an embodiment of the present invention, illustrating the use of a heat concentrator.

FIG. 6 shows a schematic of another embodiment of the spray cooling system of the present invention illustrating the use of heat spreaders.

DETAILED DESCRIPTION OF THE INVENTION

Figure 7:
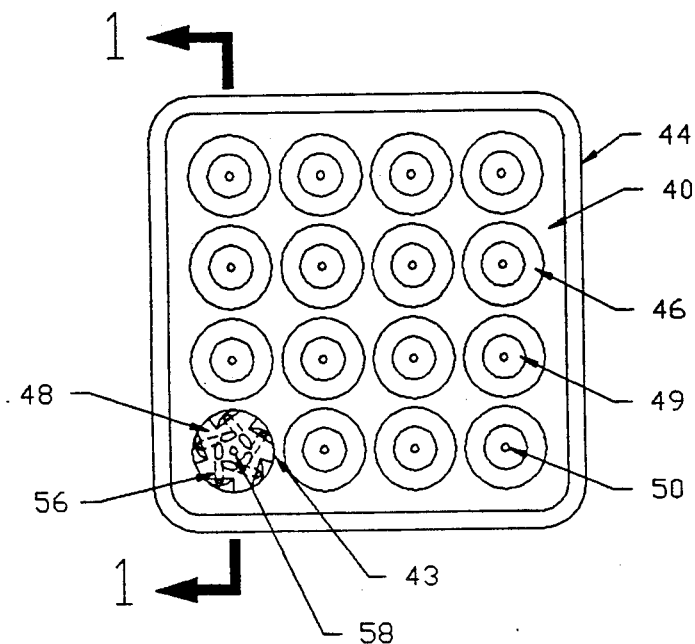
FIG. 7 shows a top plan view of an array of atomizers for a spray cooling system of the present invention.

Spray cooling has been employed in some form for many years, for example, the cooling of rollers in a steel mill. More recently, spray cooling has been the subject of numerous experiments and investigations on its viability as an efficient technique for a wide variety of applications in electronics. However, these investigations have been no more useful than establishing the excellent heat transfer potential of spray cooling. Generally, a commercially available atomizer has been used to cool a heat source of approximately 1 cm$^2$, or less, by researchers investigating the feasibility of cooling microelectronics. FIG. 1 shows a prior art view of an example of an experimental spray cooling setup. A heat source 1 is surrounded by a heat concentrator 2, which transfers heat from the heat source to the outer surface 4 to be cooled. The arrows leading from the heat source to the surface 4 indicate heat flux lines. The heat source and concentrator are surrounded by insulation 6 to avoid any loss of heat except at the surface 4. The atomizer 8 is a commercially available unit that generates a conically shaped spray cone 10 at a relatively large distance away from the surface 4. Part of the system volume of the spray cooling system is enumerated 12. The system volume is defined as the amount of volume that the spray cooling system uses to spray fluid upon the surface and remove the fluid from the heat source. The system volume is thus determined by variables such as the distance of the atomizing nozzle from the heat source, and the efficiency of the method used to remove fluid from the volume. Although experimental investigations of spray cooling systems have been useful in examining the characteristics and variables of such, these investigations have yet to lead to a successful application of a compact, efficient system to microelectronics, or other devices where small size, efficiency and high heat flux are desired.

Although experimentation has shown spray cooling to be more efficient than jet impingement cooling, there have been two major unresolved issues that have heretofore prevented the successful application of spray cooling in a compact package. The first issue deals with fluid management, the removal of fluid and vapor from an area in a manner which does not disrupt the sprays in a package small enough to be attractive for microelectronics applications.

The second issue deals with the shortcomings of existing atomizers. An example of such an atomizer is within U.S. Pat. No. 3,692,245 to Needham et al. Known conventional atomizers have been designed to be used in a single housing which is attached to a fluid supply pipe. The use of such an atomizer in a spray cooling system leads to a system which in physical dimension is an order of magnitude larger than is desired for a compact and effective spray cooling system to be used in the microelectronics field. Further, the atomizer characteristic dimensions are substantially larger than those of the atomizers of the present invention. Thus, the sprays require more distance from the orifice exit to develop adequate uniformity and patternation. Also, the larger the atomizer characteristic dimensions, the coarser the achievable spray in droplet size and distribution.

The present invention resolves both of these issues and their respective sub-issues. The invention uses an array of miniature atomizers contained within a common housing. The reduced atomizer dimensions and elimination of individual atomizer housings allows a close packed array, with the individual sprays overlapping a short distance from the discharge orifices. A plurality of atomizers set a very close distance to the heat source would deliver a uniform spray equivalent to a single large nozzle several inches away. This is achieved with better atomization, because of the smaller characteristic dimensions of the miniature atomizers. There is also less momentum loss because of the shorter distance travelled, and the array can be operated at a reduced pressure to achieve the same cooling as a single nozzle removed by several inches. This benefits the overall system with reduced equipment and power requirements.

Two of the sub-issues of spray cooling resolved by the present invention is the interaction of sprays in a multi-nozzle arrangment and the removal of vapor from the system. FIG. 4 shows the use of closely spaced and overlapped spray cones, the sprays are overlapped so that there are no uncovered areas. In this case, when combined with efficient removal of the fluid from the periphery of the cooled area (not shown), the spray cones intersecting at point 34 above surface 33 act to keep the fluid down within the liquid film 32, and prevent the fluid from recirculating and interfering with the issuing sprays.

The array of atomizers of the present invention can be positioned to directly spray a plurality of individual heat sources, such as microchips. The array can also be used to cool the heat sources indirectly through the use of a heat spreader or concentrator. The atomizer array can be positioned as close as ¼ inch from a surface such as an arrangement of microchips. The entire module can be contained within a depth of less than one inch. The capability of the cooling package to be contained in such a small package coincides with design criterion to reduce overall package dimensions.

FIG. 5 shows a schematic cross-section of the spray cooling system of the present invention using a heat concentrator. This application of the spray cooling system uses a heat concentrator 64 to deliver the heat from the plurality of low power heat sources 60 to a small external surface 65 of the concentrator. The atomizer array 40 allows the individual atomizers 42a to deliver the atomized sprays at an angle to the external surface 65 of the concentrator. The heat concentrator may be constructed from any high thermal conductivity material such as artificial diamond, graphite, copper, etc. In this illustration, the fluid removal means is not shown. Surface 65 could be surrounded by a fluid removal slot, or alternatively, the excess fluid could be allowed to run down over the heat sources 60 and heat concentrator 41, and removed at the far end. This would augment the spray cooling with the technique referred to as "falling film". Such an embodiment would be gravity dependent, but there are many potential applications, such as massively parallel supercomputers which are stationary and employ tens of thousands of relatively low power logic and memory chips.

FIG. 6 shows a schematic cross-section of the spray cooling system using a heat spreader. In this embodiment of the invention, a single very high power heat source 60 is shown delivering heat through a heat spreader 68 having a broad external surface 69. The heat source is indirectly cooled by the atomizer array 40 by directing the spray from individual atomizers across the breadth of the surface 69. The heat spreader 68 and atomizer array 40 could be expanded in size to accomodate a plurality of heat sources 60.

As previously mentioned, the substantially flat, thin array of miniature atomizers is central to the invention. FIG. 7 is a plan view of an atomizer array housing 44, while in this particular case is configured for a square array of 16 atomizers, it should be understood that the housing 44 can be designed for any variety of configurations. The spray plate may also be configured to spray from both sides of the heat source. An atomizer 42 is formed by fitting an individual swirler insert 48 into the cylindrical depression 46. The swirler depression further comprises a central conical depression 49 and a discharge orifice 50 at the center of the conical depression 49. This arrangement thus comprises an atomizer generally referred to as a simplex pressure-swirl atomizer.

Figure 8:
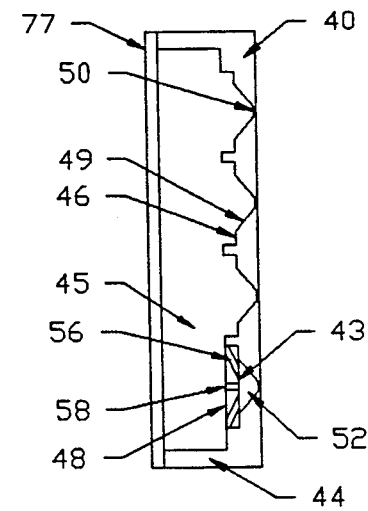
FIG. 8 shows a cross-sectional view of the array of atomizers shown in FIG. 7.

FIG. 8 shows a cross section of the atomizer array 40. It can be seen in this view that the central conical depression 49 forms a swirl volume 52. The cooling fluid flows from the back of the array (shown on the right side of FIG. 8) in the direction shown by the arrow at the top of FIG. 8. Fluid is delivered to the fluid supply volume 45 by a pump, not shown. A backing plate 77 covers the array housing and serves to contain the fluid within the atomizer assembly, leaving only the atomizers as a means for the fluid to exit the assembly. The fluid flows through the swirler insert 48, as will be explained below, and is released into the swirl volume where the conical depression 49 maintains the generally circular flow of the fluid. The fluid exits the discharge orifice 50 with a ratio of tangential to normal momentum that enables it to form a finely atomized, dense, wide-area spray.

Figure 9:
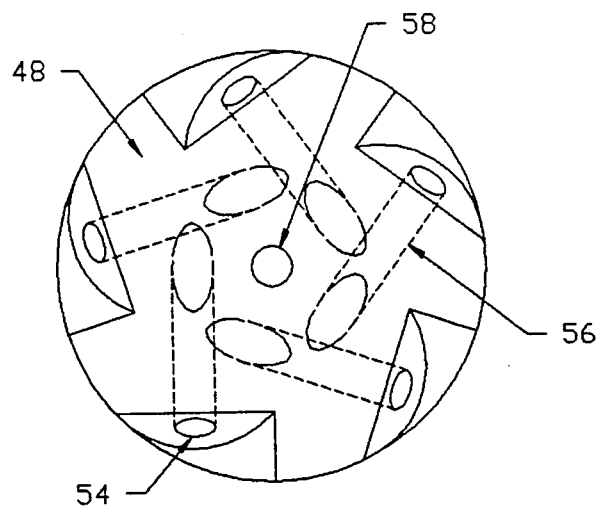
FIG. 9 shows a top plan view of an individual swirler insert used within the atomizers shown in FIGS. 7 and 8.
Figure 10:
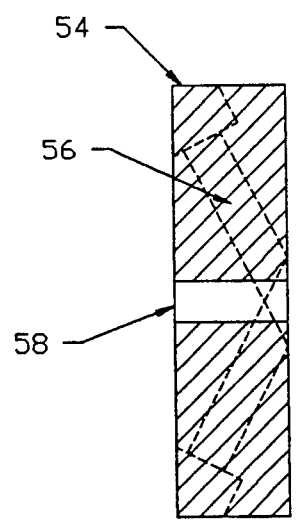
FIG. 10 shows a cross-sectional view of the insert shown in FIG. 9.

Details of the swirler insert 48 may be seen within FIGS. 9 and 10. The insert includes swirl port inlets 54 arranged around the periphery of the insert to allow fluid to enter into the swirl ports 56 from the backside of the atomizer array, as previously mentioned. The swirl port inlets are arranged at a consistent angle to form a tangent to the swirl volume 52. The swirl port inlets are directed toward one another such that the fluid exiting the swirl ports enters the swirl volume 52 so as to induce rotation of the fluid within the swirl volume, generally as shown by the arrow within FIG. 9. A center jet 58 discharges additional fluid into the swirl volume to assist in the development of a uniform spray, the properly sized center jet prevents the middle of the spray from being either "hollow" or "heavy" with respect to the outer regions. The discharge orifice 50 can be modified at its exit if other than a circular spray cone is desired, for example, a square pattern.

Figure 11:
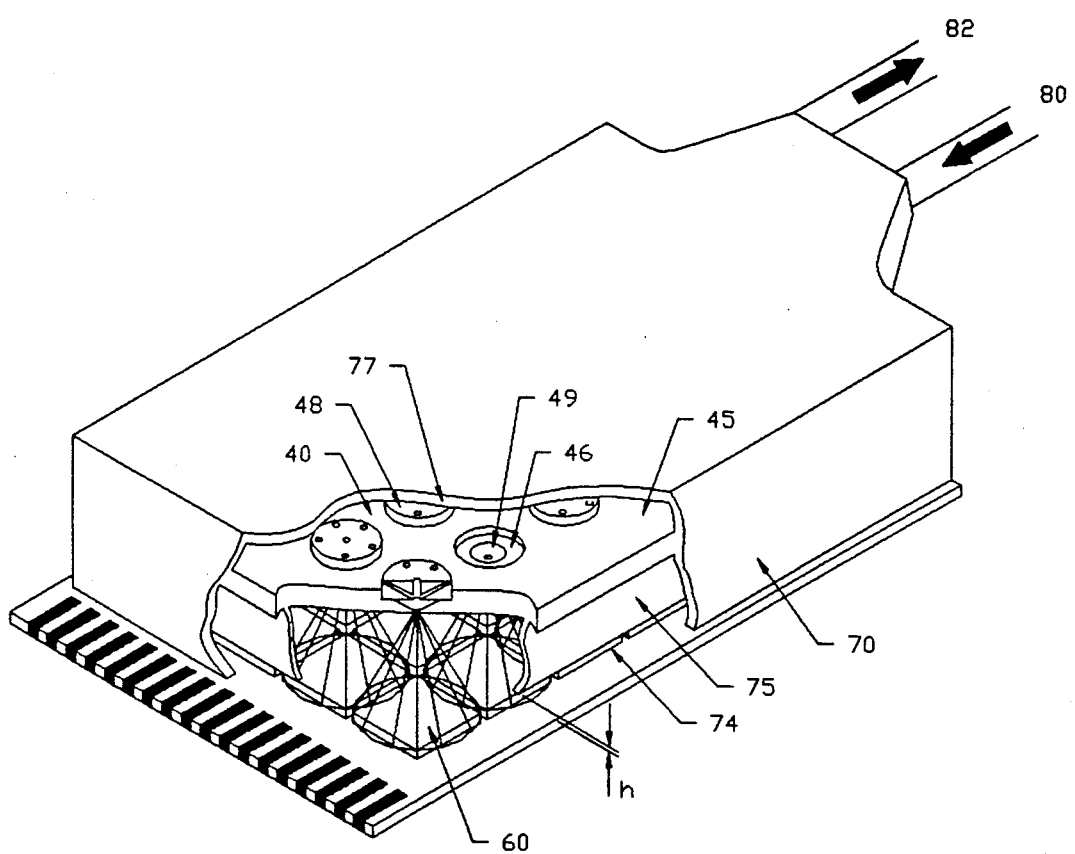
FIG. 11 shows a perspective view of the embodiment of FIGS. 7-10.

The fluid removal from the module is another key element of the system. The relationship between the atomizer assembly and one embodiment of the fluid removal housing 70 is shown in the cut away perspective view of FIG. 11. The fluid removal housing surrounds the directly cooled heat source(s) 60, which could alternatively be heat spreaders or concentrators. A slot 74, which is vertical with respect to the heat sources 60, surrounds the entire periphery of the heat sources. The outside wall of slot 74, which also forms the outer wall of housing 70, is mechanically sealed to the heat source surface to control fluid leakage. The inner wall 75 is raised a distance "h" above the surface of the heat sources. The distance "h" is critical to the performance of the system, and is a variable of design for different applications. In addition to the peripheral slot 74, fluid may be removed from between adjacent heat sources, either from below, via passages in the substrate, or from above by passages extending from the housing 70.

The housing 70 includes the atomizer array 40 with a plurality of closely spaced cylindrical depressions 46 for housing a plurality of swirler inserts 48. The figure shows the surface divided into distinct rectangles to show that the surface can be a continuous surface or a divided surface with separate cooled surfaces. The fluid paths are shown by the arrows which begin from the fluid supply port, goes through the swirler inserts 48, sprays onto the surface 60, and exits the system through the fluid removal slots 74 (formed between the inner wall 75 and outer housing wall 70) and the fluid removal port 82. It should be appreciated that a network of converging conduits transport the fluid from the slots 74 to the fluid removal port 82.

In operation, the vapor generated by the heat transfer process escapes from the surface of the thin liquid film. In some applications, it may be desirable to augment this vapor supply by one of two ways, or a combination of ways thereof. One, a secondary vapor or gas flow is supplied to the volume 79. An alternate method is to use a coolant such as a fluorinert TM (trademarked by the 3M Company) which has a very high affinity for dissolving gases into it. The heat transfer process releases this gas, which is then available for assisting in liquid removal.

The liquid film itself, under the influence of the impinging spray droplets, moves consistently radially outward from the center of the area covered by the array. The fluid removal slot 74 collects this fluid with minimum resistance, so as not to destroy the momentum of the liquid film. Under the additional influence of mechanical pumping (not shown) the fluid is encouraged to enter the slot and be removed from the module without piling up within. If the fluid is allowed to pile up, sprays would be interfered with and the thin liquid film conditions which promote high heat flux would be destroyed. The previously mentioned escaped vapor is also utilized in the liquid removal process, and is actually instrumental in the success of the cooling system. With less inertia, it much more easily negotiates the turns necessary in channeling the liquid out of the module. The viscous drag between the faster moving vapor, and slower moving liquid helps to sweep the surface and keep the liquid film thin, and to drag or entrain the liquid through slot 74 and into the fluid removal duct.

As described, the operation of this spray cooling system relies on the fluid momentum generated by the atomizers, and by mechanical pumping of the volume 79. As such it does not rely on gravity for operation, and is in fact resistant to large accelerations in any direction. Thus, the spray cooling system of the present invention is suitable for many applications within the transportation, avionics and aerospace industries.

The spray cooling system of the present invention can be configured in a variety of shapes and number of atomizers by changing the basic shape and configuration of the atomizer array. The spray cooling system provides an efficient and improved system for cooling in a wide variety of applications.

It should be apparent that many modifications could be made to the spray cooling system which would still be encompassed within the spirit of the present invention. It is intended that all such modifications may fall within the scope of the appended claims.

What is claimed is:

1. An evaporative spray cooling system for cooling a surface comprising:
    a housing for containing said cooling system, said housing having an atomizer array spaced a predetermined distance from the cooled surface, said housing further comprising at least one fluid supply port and at least one fluid removal port;
    at least one atomizer arranged within said array, said atomizer having a discharge orifice capable of delivering a wide area spray of liquid droplets to said cooled surface, said liquid droplets distributed uniformly and evenly over the area of the cooled surface;
    a means to conserve and use the momentum of said liquid droplets to maintain a thin liquid film on the cooled surface and to remove fluid and resulting vapor from the system.

2. A spray cooling system as claimed in claim 1, wherein, said array comprises a plurality of closely spaced atomizers which form a plurality of wide area sprays, respectively, for cooling the cooled surface.

3. A spray cooling system as claimed in claim 2, wherein, said plurality of sprays intersect with one another prior to impinging upon the cooled surface;
    wherein, said intersecting sprays provide a uniform cooling over the entire area of the cooled surface and serve to minimize the amount of fluid and vapor build-up on the cooled surface.

4. A spray cooling system as claimed in claim 1, wherein, said atomizer comprises a plurality of swirl ports that deliver said fluid into a swirl volume prior to exit from said discharge orifice, said swirl ports positioned such that said fluid is given a rotational velocity as it moves through said swirl volume;
    said means to atomize said fluid droplets further comprising an orifice axially aligned with said discharge orifice, and positioned to provide fluid to the swirl volume.

5. A spray cooling system as claimed in claim 1, wherein, said means to remove said excess liquid and vapor comprises means to remove said fluid from the periphery of the cooled surface.

6. A spray cooling system as claimed in claim 5, wherein, said means to remove said fluid from the periphery of said cooled surface comprises means to channel said fluid in a direction toward said fluid removal port, said channel means allowing said fluid to enter by the momentum given to said fluid from said wide area spray.

7. A spray cooling system as claimed in claim 5, wherein, said means to remove said fluid and vapor further comprises a secondary vapor added to the system to assist in the removal of the primary gas and fluid from the system.

8. An evaporative spray cooling system, as claimed in claim 1,
    wherein, said liquid droplets are discharged from said discharge orifice in a direction disposed at an angle to the cooled surface and subsequently impinge directly against said thin liquid film disposed upon the cooled surface;
    said means to conserve and use the momentum of said liquid droplets to maintain a thin liquid film on the cooled surface and to remove fluid from the system comprises a transference of said momentum of said liquid droplets upon impinging against said thin liquid film to a momentum parallel to said cooled surface and in a direction toward a free edge of the cooled surface;
    said spray cooling system further comprising channel means at said free edge of the cooled surface to use said transferred momentum to move said fluid out of said system through said fluid removal port.

9. An evaporative spray cooling system for cooling a surface comprising:

a housing for containing said cooling system, said housing having an atomizer array spaced a predetermined distance from the cooled surface, said housing further comprising at least one fluid supply port and at least one fluid removal port;

at least one atomizer arranged within said array, said atomizer having a discharge orifice capable of delivering a wide area spray of liquid droplets to the cooled surface to form a thin liquid film upon the cooled surface, said thin liquid film distributed uniformly and evenly over the area of the cooled surface, to allow heat to transfer from the surface to said liquid film and a resulting vapor which forms in response to partial evaporation of said liquid film;

a means to conserve and use the momentum of said liquid droplets to maintain a thin liquid film on the cooled surface and force excess fluid away from said cooled surface;

a means to remove fluid and said vapor from the system including using the momentum of said vapor to sweep said excess fluid through said fluid removal port.

10. An evaporative spray cooling system as claimed in claim 9, wherein, said fluid removal port comprising channel means adjacent a free edge of the cooled surface to receive said excess fluid;

said vapor acts as a pumping means to assist in removing excess fluid from the system by viscous drag of said vapor sweeping across said excess fluid.

* * * * *